(12) United States Patent
Diede et al.

(10) Patent No.: US 6,370,613 B1
(45) Date of Patent: Apr. 9, 2002

(54) CONTENT ADDRESSABLE MEMORY WITH LONGEST MATCH DETECT

(75) Inventors: Thomas Diede, Cupertino; John R. Mick, San Jose, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/361,680

(22) Filed: Jul. 27, 1999

(51) Int. Cl.$^7$ .............................................. G06F 12/04
(52) U.S. Cl. ...................... 711/108; 711/103; 711/100
(58) Field of Search ................................. 711/108, 103, 711/100

(56) References Cited

U.S. PATENT DOCUMENTS 6,219,748 B1 * 4/2001 Srinivasan et al. .......... 711/108
6,237,061 B1   5/2001 Srinivasan et al.
6,240,485 B1 * 5/2001 Srinivasan et al. .......... 711/108

* cited by examiner

*Primary Examiner*—Reba I. Elmore
(74) *Attorney, Agent, or Firm*—Beaver, Hoffman & Harms LLP

(57) ABSTRACT

A CAM system is provided for determining which data word in a CAM array exhibits the longest continuous, unmasked match with an input data value. The input data value is divided into non-overlapping subfields, thereby creating a series of keys, the first key of the series including either the least significant bit (LSB) or most significant bit (MSB) of the input data value. The CAM array is divided along columns into a similar series of non-overlapping sub-arrays corresponding to the subfields defined by the series of keys. A first CAM sub-array compares the first key with its stored rows of data bit values to generate a first match signal. The first match signal disables each row of the second CAM sub-array for which the corresponding row of the first CAM sub-array did not show a match. A second CAM sub-array then compares the second key with its enabled rows to generate a second match signal. The second match signal disables each row of the third CAM sub-array for which the corresponding row of either the first or second CAM sub-array did not show a match. This comparison process continues in sequence with the remaining keys and CAM sub-arrays. The row of the CAM array that shows a match over the most consecutive comparison operations contains the longest match for the input data value. If multiple rows match over the same number of comparison operations, a priority encoder determines which location has the highest priority.

44 Claims, 9 Drawing Sheets

CONTENT ADDRESSABLE MEMORY WITH LONGEST MATCH DETECT

BACKGROUND OF THE INVENTION

1. Field of the Invention

The present invention relates to content addressable memory (CAM) systems. More specifically, the present invention relates to methods and structures for performing a longest match operation in a CAM system.

2. Discussion of Related Art

CAM cells are defined as memory cells that are referenced in response to their content, rather than by a physical address in an array. FIG. 1 shows a block diagram of a conventional CAM array 100 including twelve CAM cells, three match lines $ML_0$–$ML_2$, four data lines $DL_0$–$DL_3$, four complementary data lines $DL_0\#$–$DL_3\#$, and a splitter 110. A CAM array is specified by a depth, equal to its number of rows, and a width, equal to its number of columns that define the number and length, respectively, of words that can be stored in the array. For example, CAM array 100 has a depth of three bits (three rows) and a width of four bits (four columns) and is therefore a 3×4 array capable of storing three words of four bits each.

The individual CAM cells in CAM array 100 are labeled $C_{x,y}$, where X is the row of the array and Y is the column of the array. Thus, CAM array 100 includes CAM cells $C_{0,0}$ to $C_{2,3}$. Each row of CAM cells is coupled to a common match line, and each column of CAM cells is coupled to a common data line and a common complementary data line. For example, CAM cells $C_{0,0}$, $C_{0,1}$, $C_{0,2}$, and $C_{0,3}$ are all coupled to match line $ML_0$. Similarly, CAM cells $C_{0,0}$, $C_{1,0}$, and $C_{2,0}$ are all coupled to data line $DL_0$ and complementary data line $DL_0\#$. In the described example, the data bit value stored in each CAM cell is indicated by either a "0" or a "1" in brackets. For example, CAM cells $C_{0,0}$, $C_{0,1}$, $C_{0,2}$, and $C_{0,3}$ store data bit values of 0, 1, 0, and 0, respectively.

The CAM array 100 is addressed by providing a data bit value to each column of stored bit values, or bit slice, in the array. Splitter 110 receives an input word as a four-bit input data value ID[3:0], and applies the individual data bit values ID[0], ID[1], ID[2] and ID[3] to data lines $DL_0$, $DL_1$, $DL_2$, and $DL_3$, respectively. Splitter 110 also provides complementary data bit values ID#[0], ID#[1], ID#[2] and ID#[3] to columns 0, 1, 2, and 3, respectively, by complementary data lines $DL_0\#$, $DL_1\#$, $DL_2\#$, and $DL_3\#$, respectively. Each row of CAM memory cells includes match logic (not shown) to indicate when a match condition occurs, i.e., when the data bit values stored in the CAM memory cells of that row match the applied data bit values ID[3:0]. For example, if the data bit values ID[0], ID[1], ID[2], and ID[3] are 0, 1, 0, and 0, respectively, the data bit values stored in the CAM cells along row 0 match the applied data bit values. Under these conditions, a match signal $MS_0$ on match line $ML_0$ is asserted TRUE. Because the applied data bit values do not match the data bit values stored in the CAM memory cells of rows 1 and 2, match signals $MS_1$ and $MS_2$ on match lines $ML_1$ and $ML_2$, respectively, are deasserted. Match signals $MS_0$–$MS_2$ can be used to determine any or all row addresses within CAM array 100 which have their match line asserted.

A CAM array does not always contain a match for a given input data value. However, some of the bits of a row may match the input data value, while other bits of the row do not match the input data value. In such cases, it is often desirable to locate the stored word that provides the "longest match" with the input word. This "longest match" determination involves selecting the row of CAM cells containing the longest string of data bit values providing a match with the data bit values of the input word, starting from either its least significant bit (LSB) or most significant bit (MSB).

FIG. 2 shows a block diagram of a conventional CAM system 200 providing longest match capability. CAM system 200 includes a bit-wise mask logic 210, a M×N CAM array 220, a no-match decoder 230, a priority encoder 240 and software 250 for controlling the recursive mask generation process. Bit-wise mask logic 210 specifies a set of bits, or "subfield", from input data value ID[N-1:0] in response to a MASK signal received from software 250. The MASK signal is initially selected to cause only the shortest subfield of bits ID[N-1:0] to be transmitted through mask logic 210. This subfield of bits is transmitted to CAM array 220 as a key K, K#. CAM array 220 simultaneously compares key K, K# with all the stored words in its M rows of CAM cells, generating a match signal MS[M-1:0] made up of individual match signals $MS_{M-1}$–$MS_0$. If the applied data bit values specified by key K, K# match the corresponding stored data bit values in any row of CAM cells in CAM array 220, the corresponding match signal is asserted TRUE.

If at least one of the match signals MS[M-1:0] is asserted TRUE, no-match decoder 230 provides a logic FALSE NO_MATCH signal to software 250. In response, software 250 generates another MASK data word, which is selected to cause a wider subfield of bits ID[M-1:0] to be transmitted through mask logic 210. Note that software 250 must wait for no match decoder 230 to generate the NO_MATCH signal before generating the next MASK data word. Consequently, mask logic 210, 220, 230 and 240 is very much under-utilized, and the resultant throughput is low.

To perform a longest match operation, bit-wise mask logic 210 provides wider and wider subfields of input data value ID[N-1:0] until no match is detected with any row of CAM array 220. The subfields are widened by software 250, which progressively increases the number of enabling bits in the MASK data word. When no match is detected, no-match decoder 230 asserts a logic TRUE NO_MATCH signal, which causes priority encoder 240 to provide an address M_ADDR of the last match indicated by CAM array 220. If more than one match was indicated during the last pass, priority encoder 240 provides an address having the highest priority (e.g., the lowest address).

Although CAM system 200 is able to determine the longest match for a given input data value, the recursive comparison loops significantly increase the time required to perform the operation. In addition, the time required to obtain a result is non-deterministic (i.e., the result can be obtained after one recursive loop, two recursive loops, etc.). This can often have undesirable effects at the system level.

FIG. 3 shows a block diagram of another conventional CAM system 300 providing longest match capability. CAM system 300 includes mask logic blocks 310a, 310b, 310c, and 310d, an M×N 3CAM array 320, no-match decoders 330a, 330b, 330c, and 330d, first-level priority encoders 340a, 340b, 340c, and 340d, and second-level priority encoder 350. Mask logic blocks 310a–310d receive an N-bit input data value ID[N-1:0] and specify keys Ka–Kd, respectively.

Keys Ka–Kd represent successively wider subsections of input data value ID[N-1:0], starting from either its LSB or MSB. Keys Ka, Kb, Kc, and Kd have widths A, B, C, and D, respectively, where 0<A<B<C<D≦N. Each key is compared to all of the words stored in CAM array 320. In response, CAM array 320 generates a set of match signals for each key. For example, CAM array 320 generates a first set of match signals MSa[M-1:0] in response to key Ka, and a second set of match signals MSb[M-1:0] in response to key Kb. Each set of match signals is provided to a corresponding first-level priority encoder and a corresponding no-match detector. For example, the first set of match signals MSa [M-1:0] is provided to first-level priority encoder 340*a* and no-match decoder 330*a*.

If a match with key Ka is indicated by the first set of match signals MSa[M-1:0], first-level priority encoder 340*a* generates an address for the matching word having the highest priority (where the "highest priority" is the lowest address having a matching word). If a no-match condition is detected, no-match decoder 330*a* asserts a logic TRUE signal. The outputs of first-level priority encoders 340*a*–340*d* and no-match decoders 330*a*–330*d* are coupled to second-level priority encoder 350, which provides the location of the word matching the widest key as address M_ADDR. For example, if no-match decoder 330*c* asserts a logic TRUE signal but no-match decoder 330*b* does not, second-level priority encoder 350 provides the address generated by first-level priority encoder 340*b* as longest match address M_ADDR.

Because CAM system 300 includes separate match logic for each key, it avoids the slow throughput resulting from multiple recursive passes associated with CAM system 200 (FIG. 2). However, CAM system 300 includes multiple mask logic blocks, multiple first-level priority encoders, multiple no-match decoders, and additional match logic (i.e., a second level priority encoder), which greatly increases hardware requirements of CAM system 300, increasing circuit size, complexity and cost.

It is therefore desirable to provide a CAM system that provides efficient longest match determination in a compact structure.

SUMMARY

Accordingly, the present invention provides a CAM system including a CAM array and a splitter logic circuit. An input data value is divided into non-overlapping subfields by the splitter logic to form a series of keys. The keys can be any width. The first key of the series typically includes one or more bits from the least significant bit (LSB) side of the input data value, or one or more bits from the most significant bit (MSB) side of the input data value. The first key can be any width. The CAM array is divided along columns into a similar series of non-overlapping sub-arrays corresponding to the subfields defined by the series of keys. Therefore, the first CAM sub-array of the series typically contains either the LSB's or MSB's of all the words stored in the CAM array, as dictated by the configuration of the first key.

The first CAM sub-array simultaneously compares the first key with all its stored rows of data bit values to generate a first set of match signals. The first set of match signals disables each row of the second CAM sub-array for which the corresponding row of the first CAM sub-array did not show a match. During the next clock cycle, the second CAM sub-array simultaneously compares the second key to all of its enabled rows of stored data bit values to generate a second set of match signals. The second set of match signals disables each row of the third CAM sub-array for which the corresponding row of either the first or second CAM sub-array did not show a match. This comparison process is continued with all the keys in sequence.

Each successive comparison operation disables the match logic of more and more rows. The row of the CAM array that shows a match over the greatest number of comparison operations contains the longest match for the input data value. If multiple rows show a match over the same number of comparison operations, a priority encoder determines which location has priority.

Because the keys produced by the splitter logic are non-overlapping, a series of comparison operations can be pipelined to minimize the time required for the longest match. For example, if four keys are used, then four comparison operations must be performed to obtain the longest match for a first input data value. However, after this initial four-cycle latency period, a longest match can be provided for an additional input data value during each subsequent cycle.

At the same time, because each key is compared only to the corresponding subfields of the stored words, multiple copies of mask registers and match logic circuits are not required. This greatly simplifies the circuit design and reduces hardware costs compared with CAM system 300 shown in FIG. 3.

The widths of the keys can be set to provide as fine or coarse a comparison resolution as desired. By making each key a single bit, the most finest resolution comparison can be made between the input word and the stored words. By increasing the number of keys, the latency time required for the comparison process will be increased; however, the throughput of one longest match per cycle is maintained. Moreover, the key width can vary from key to key.

DETAILED DESCRIPTION

Figure 1:
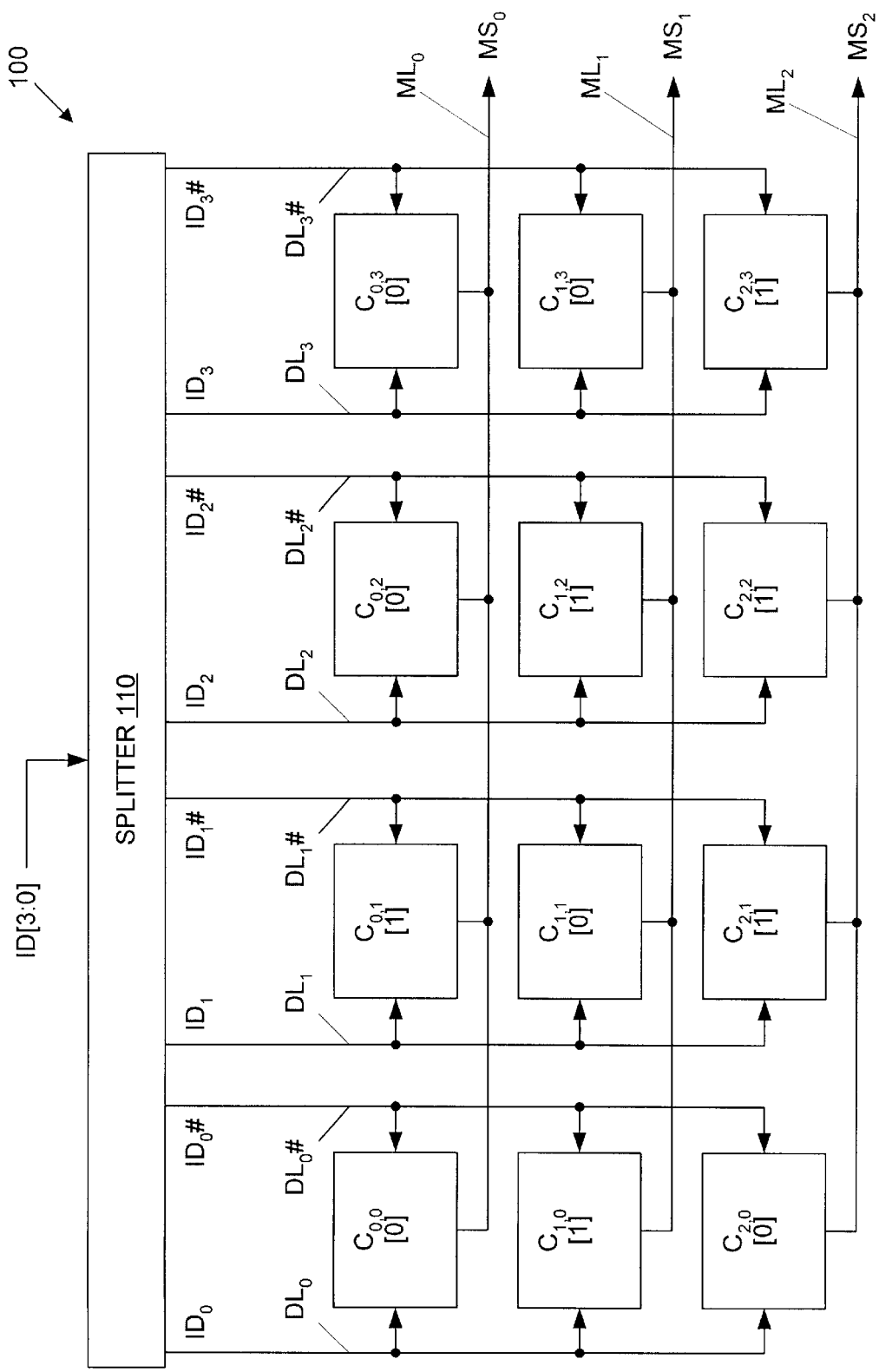
FIG. 1 is a block diagram of a conventional array of CAM cells.
Figure 2:
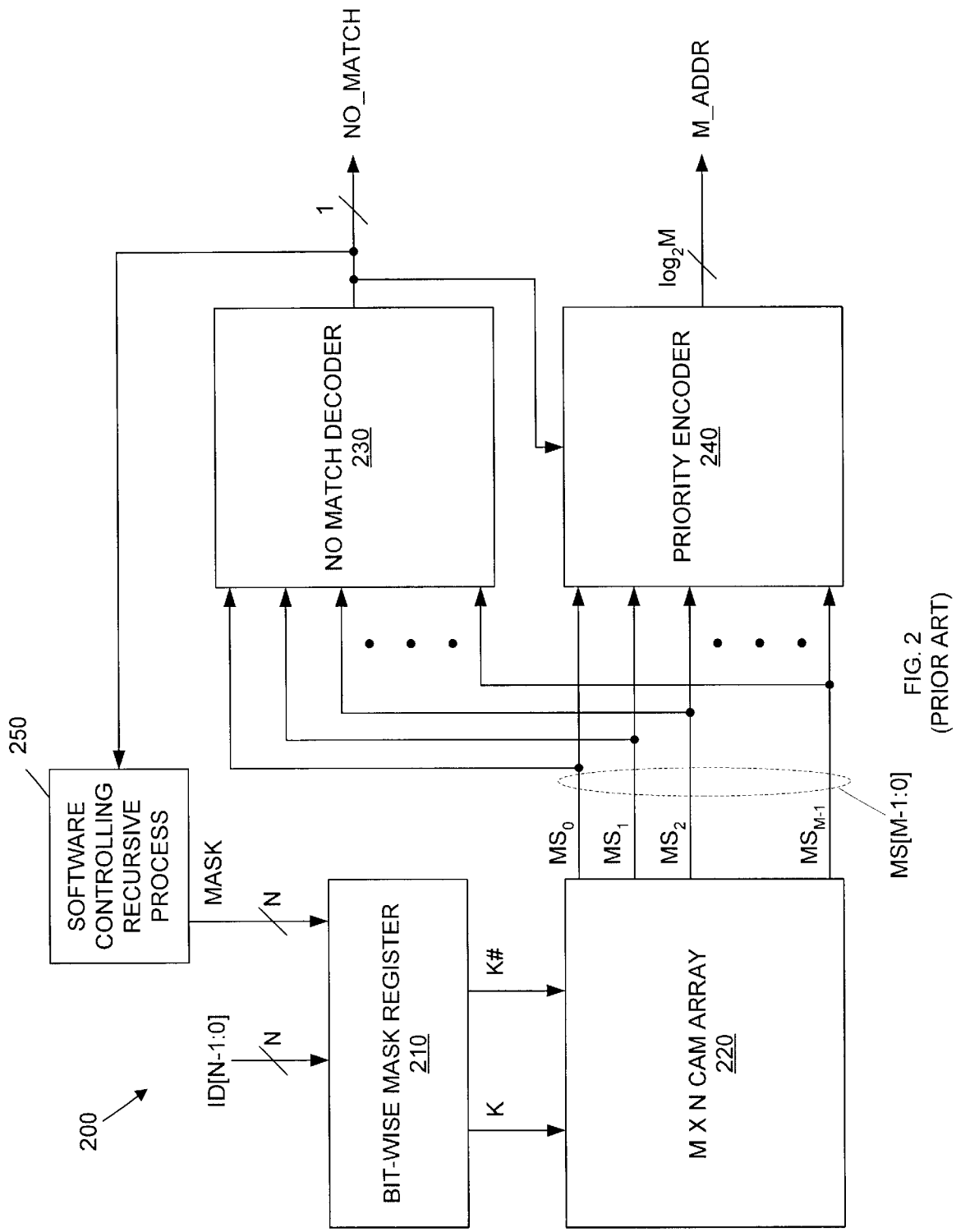
FIG. 2 is a block diagram of a conventional CAM system providing longest match capability through recursive comparison operations.
Figure 3:
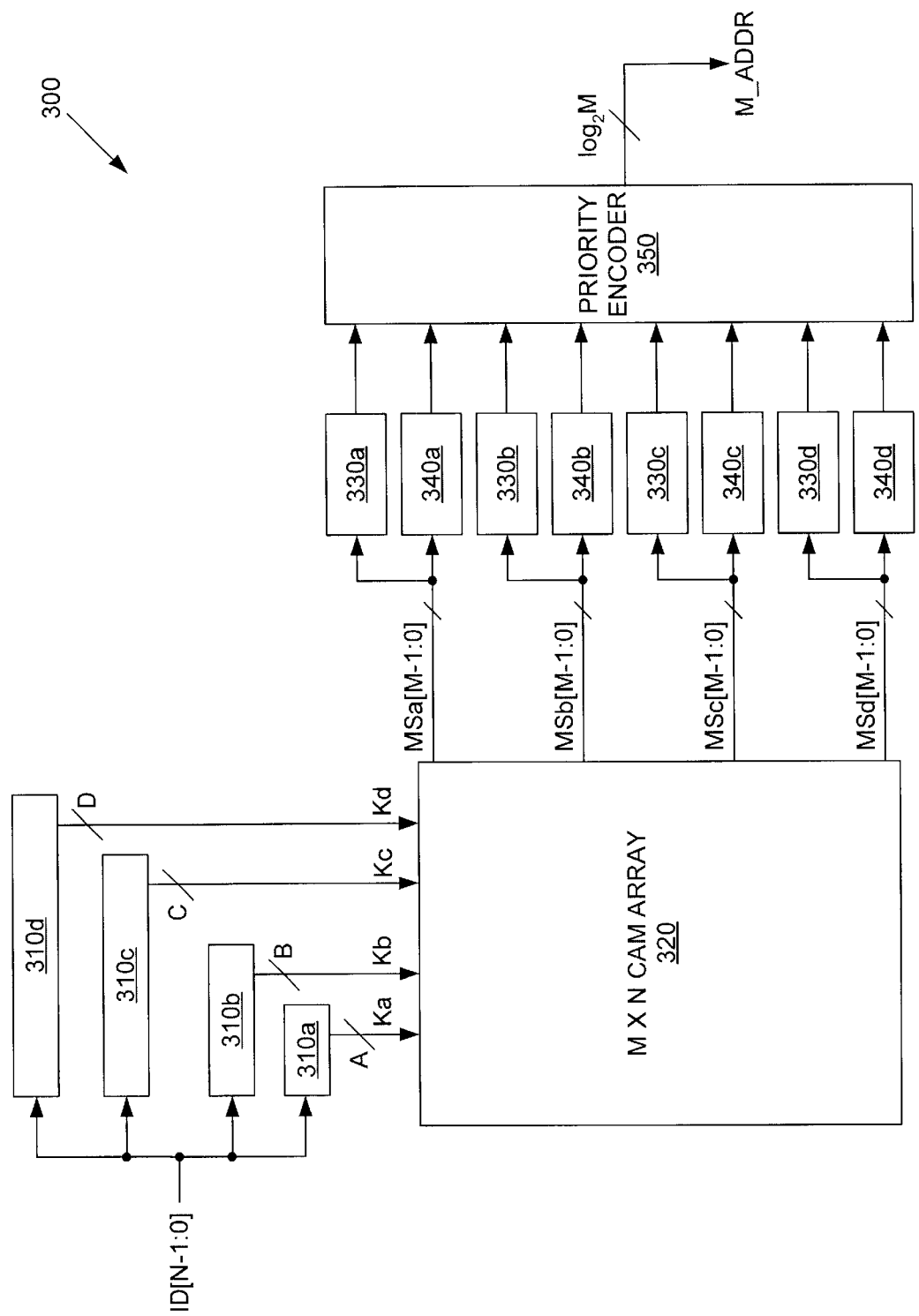
FIG. 3 is a block diagram of a conventional CAM system providing longest match capability through multiple copies of match logic.
Figure 4:
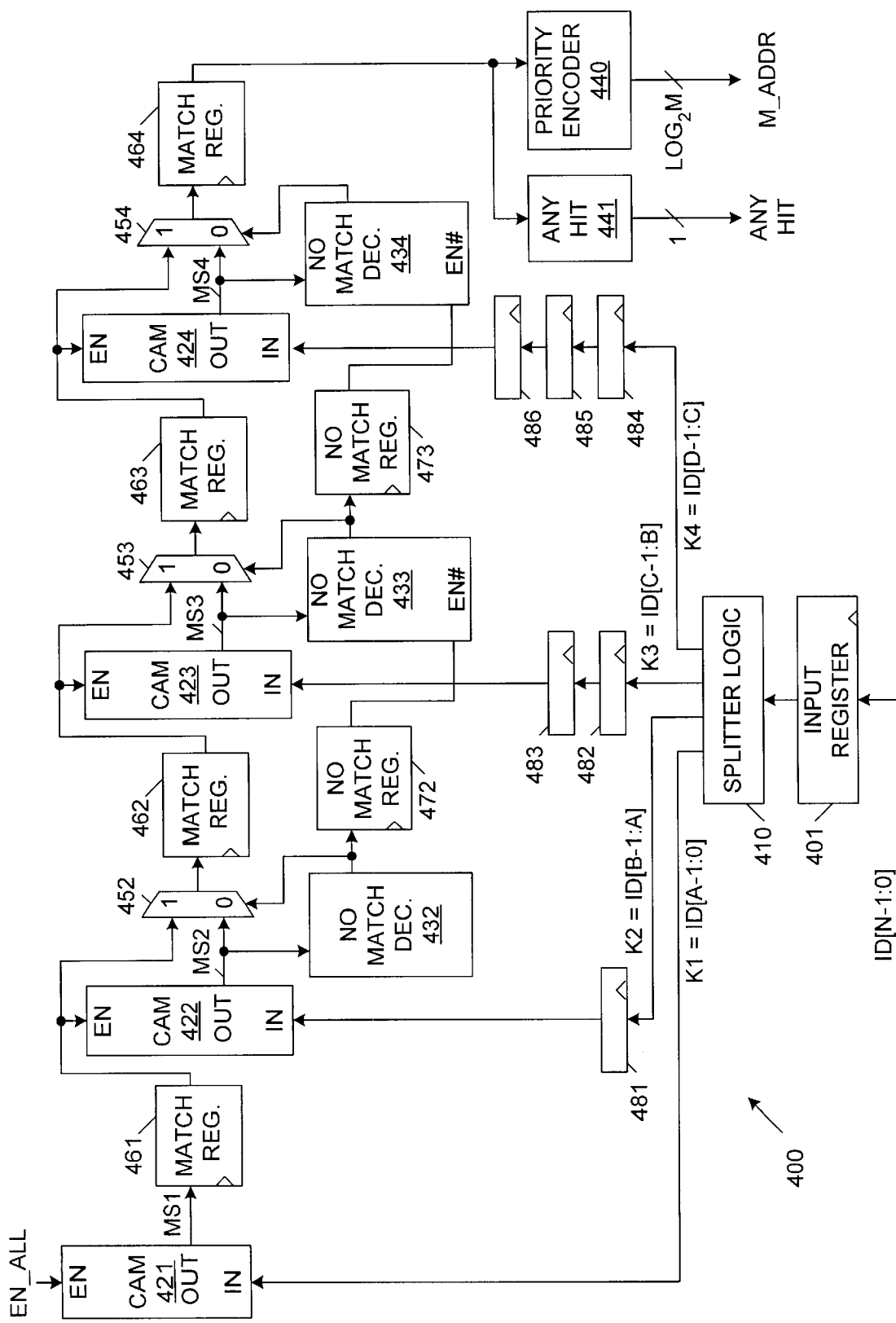
FIG. 4 is a block diagram of a CAM system having a pipelined longest match capability in accordance with an embodiment of the present invention.

FIG. 4 is a block diagram of a CAM system 400 in accordance with one embodiment of the present invention. CAM system 400 includes CAM sub-arrays 421–424. Each of CAM sub-arrays 421–424 comprises an array of CAM cells having depth M, representing sequential bit slices of the total memory space of CAM system 400. Although four CAM sub-arrays are shown for explanatory purposes, it is noted that the present invention is not limited to a CAM system having a particular number of CAM sub-arrays. CAM system 400 further includes input register 401, splitter logic 410, no-match decoders 432–434, a priority encoder 440, ANY_HIT decoder 441, multiplexers 452–454, match registers 461–464, no-match registers 472–473, and pipeline registers 481–486. Input register 401, match registers 461–464, no-match registers 472–473, and pipeline registers 481–486 are all driven by the same clock signal to ensure proper timing of CAM system 400.

Splitter logic 410 receives an N-bit input data value ID[N-1:0] and subdivides this data value into a first key K1, a second key K2, a third key K3, and a fourth key K4. Keys K1, K2, K3, and K4 are equal to data bit values ID[A-1:0], ID[B-1:A], ID[C-1:B], and ID[D-1:C], where $0<A<B<C<D\leq N$. Keys K1–K4 therefore represent non-overlapping, sequential bits starting with the least significant bit (LSB) of input data value ID[N-1:0]. For example, for N equal to 4, the first key K1 is equal to a data bit value ID[0], the LSB of input data value ID[3:0]. Keys K2, K3, and K4 would then equal to data bit values ID[1], ID[2], and ID[3], respectively, representing the subsequent bits of ID[3:0]. It is noted that multiple bits in series could be selected as a particular key. It is further noted that splitter logic 410 could just as well be configured to provide a sequential set of keys starting from the most significant bit (MSB) of input data value ID[N-1:0].

Each of CAM sub-arrays 421–424 includes at least one bit slice (column) of the words stored in CAM system 400. The particular bit slices in each CAM sub-array are selected to correspond with the key associated with that CAM sub-array. For example, if key K1 includes the two least significant bits of input data value ID[N-1:0], CAM sub-array 421 would include the bit slices that contain the two least significant bits of the words stored in CAM system 400. In a similar fashion, keys K2–K4 correspond with the bit slices included in CAM sub-arrays 422–424, respectively. Like keys K1–K4, none of CAM sub-arrays 421–424 contain overlapping bits.

Each of CAM sub-arrays 421, 422, 423, and 424 compares its input key to all of its rows and generates match signals MS1[M-1:0], MS2[M-1:0], MS3[M-1:0], and MS4[M-1:0], respectively. If a match is detected in any row, the match logic at that address (row) asserts the associated match signal. For example, if a match is detected in row X of CAM sub-array 421, then CAM sub-array 421 asserts match signal MS1[X]. If more than one match is detected during a single comparison operation, multiple match signals are asserted.

Each of CAM sub-arrays 421–424 is coupled to receive a corresponding M-bit enable signal that enables or disables the match logic of individual rows within its array of CAM cells. If the match logic of a row is disabled, the output match signal from that row remains deasserted, regardless of whether or not a match with the input key is detected. Because it provides the first comparison operation, the match logic of all the rows of CAM sub-array 421 must always be enabled. CAM sub-array 421 is therefore coupled to receive a constant signal EN_ALL at its enable terminal to ensure that all the rows of CAM sub-array 421 are active (enabled). The match logic for rows within subsequent CAM sub-arrays 422–424 are enabled or disabled in response to the match signals provided by the match registers associated with the previous CAM sub-arrays.

CAM system 400 operates as follows. At an initial clock cycle T, a first input data value ID$_1$[N-1:0] is loaded into input register 401. Splitter logic 410 then divides input data value ID$_1$[N-1:0 ]into keys K1–K4. CAM sub-array 421, fully enabled by signal EN_ALL, simultaneously compares key K1 with the data bits stored in each of its rows and generates match signal MS1[M-1:0].

At clock cycle T+1, match signal MS1[M-1:0] is clocked into match register 461, and keys K2, K3, and K4 are loaded into pipeline registers 481, 482, and 484, respectively. At this time, key K2 is provided to CAM sub-array 422. Match signal MS1[M-1:0] enables the match logic in CAM sub-array 422 for only those rows that showed a match in CAM sub-array 421. Therefore, when CAM sub-array 422 compares key K2 to its rows, only those active rows can assert a logic HIGH match signal in match signal MS2[M-1:0]. Any such logic HIGH match signals indicate a word stored in CAM system 400 matching both keys K1 and K2.

Match signal MS2[M-1:0] is provided to one of the input terminals of multiplexer 452 and to no-match decoder 432. Multiplexer 452, which is coupled to receive the data stored in match register 461 (i.e., match signal MS1[M-1:0]) at its other input terminal, is controlled by the output of no-match decoder 432.

If a match is indicated by match signal MS2[M-1:0], no-match decoder 432 provides a logic LOW output to the control terminal of multiplexer 452, thereby causing match signal MS2[M-1:0] to be routed to match register 462. If no-match decoder 432 does not detect a match, this decoder 432 asserts a logic HIGH output signal that causes multiplexer 452 to route match signal MS1[M-1:0] to match register 462.

In this manner, the appropriate match signal is provided to match register 462. A match condition in CAM sub-array 422 indicates that the longest match thus far is from CAM sub-array 422, and so match signal MS2[M-1:0] is forwarded. A no-match condition in CAM sub-array 422 indicates that the longest match must be from a previous CAM sub-array, i.e., CAM sub-array 421, or that no match exists in any previous CAM sub-array. Therefore in the latter case, match signal MS1[M-1:0] is passed forward. As will be seen shortly, multiplexers 453 and 454 operate with no-match decoders 433 and 434, respectively, in the same fashion.

Also during the clock cycle T+1, a second input data value ID$_2$[N-1:0] is loaded into input register 401. Splitter logic 410 divides the second input data value ID$_2$ into four keys, and provides the first key to CAM sub-array 421. At this time, CAM sub-array 421 compares its contents with the first key of the second input data value ID$_2$, and in response, generates match signal MS1[M-1:0].

At the next clock cycle T+2, the output of multiplexer 452 is stored in match register 462, the output of no-match decoder 432 is stored in no-match register 472, and keys K3 and K4 are clocked into pipeline registers 483 and 485, respectively. As a result, key K3 is provided to CAM sub-array 423. At this time, CAM sub-array 423 performs a comparison operation. Match signal MS2[M-1:0] enables the match logic in CAM sub-array 423 for only those rows that showed a match in CAM sub-arrays 421 and 422. Therefore, when CAM sub-array 423 compares key K3 to its rows, only those active rows can assert a logic HIGH match signal in match signal MS3[M-1:0]. Any such logic HIGH match signals indicate a word stored in CAM system 400 matching keys K1, K2 and K3. Match signal MS3[M-1:0] is provided to an input terminal of multiplexer 453 and to no-match decoder 433. The other input terminal of multiplexer 453 is coupled to match register 462.

No-match decoder 433 is enabled or disabled by the signal stored in no-match register 472. If no-match register 472 stores a logic HIGH value (i.e., there was no match detected by CAM sub-array 422), then no match decoder 433 is disabled. Under these conditions, no-match decoder 433 asserts a logic HIGH output signal. This logic HIGH output signal causes multiplexer 453 to route the match signal stored in match register 462 to match register 463.

If no-match register 472 stores a logic LOW value (i.e., there was a match detected by CAM sub-arrays 421 and 422), then no-match decoder 433 is enabled. Under these conditions, no-match decoder 433 determines whether a match was detected in CAM sub-array 423. If a match was detected, then no-match decoder 433 provides a logic LOW signal to multiplexer 453 and no-match register 473. This logic LOW signal causes multiplexer 453 to route match signal MS3[M-1:0] to match register 463. If a match was not detected, then no-match decoder 433 provides a logic HIGH signal to multiplexer 453 and no-match register 473. This logic HIGH signal causes multiplexer 453 to route the contents of match register 462 to match register 463.

Also during clock cycle T+2, the match signal MS1[M-1:0] generated in response to the second input data value $ID_2$ is stored in match register 461, and the second, third and fourth keys of the second input data value $ID_2$ are stored in pipeline registers 481, 482 and 484, respectively. CAM sub-array 422 performs a comparison operation with the second key of the second input data value $ID_2$. This comparison operation is performed in the manner described above for the second key of the first input data value $ID_1$. In addition, a third input data value $ID_3$[M-1:0] is clocked into input register 401 and divided into four keys by splitter logic 410. The first key of the third input data value $ID_3$ is provided to CAM sub-array 421, and a comparison is performed. This comparison operation is performed in the manner described above for the first key of the first input data value $ID_2$.

At the next clock cycle T+3, the output of multiplexer 453 is stored in match register 463, the output of no-match decoder 433 is stored in no-match register 473, and key K4 of the first data value $ID_1$ is clocked into pipeline register 486. As a result, key K4 is provided to CAM sub-array 424. At this time, CAM sub-array 424 performs a comparison operation. Match signal MS3[M-1:0] enables the match logic in CAM sub-array 424 for only those rows that showed a match in CAM sub-arrays 421, 422 and 423. Therefore, when CAM sub-array 424 compares key K4 to its rows, only those active rows can assert a logic HIGH match signal in match signal MS4[M-1:0]. Any such logic HIGH match signals indicate a word stored in CAM system 400 matching keys K1, K2, K3 and K4. Match signal MS4[M-1:0] is provided to an input terminal of multiplexer 454 and to no-match decoder 434. The other input terminal of multiplexer 454 is coupled to match register 463.

No-match decoder 434 is enabled or disabled by the signal stored in no-match register 473. If no-match register 473 stores a logic HIGH value (i.e., there was no match detected by CAM sub-array 423), then no match decoder 434 is disabled. Under these conditions, no-match decoder 434 asserts a logic HIGH output signal. This logic HIGH output signal causes multiplexer 454 to route the match signal stored in match register 463 to match register 464.

If no-match register 473 stores a logic LOW value (i.e., there was a match detected by CAM sub-arrays 421, 422 and 423), then no-match decoder 434 is enabled. Under these conditions, no-match decoder 434 determines whether a match was detected in CAM sub-array 424. If a match was detected, then no-match decoder 434 provides a logic LOW signal to multiplexer 454. This logic LOW signal causes multiplexer 454 to route match signal MS4[M-1:0] to match register 464. If a match was not detected, then no-match decoder 434 provides a logic HIGH signal to multiplexer 454. This logic HIGH signal causes multiplexer 454 to route the contents of match register 463 to match register 464.

Also during clock cycle T+3, the third and fourth keys of the second input data value $ID_2$ are stored in pipeline registers 483 and 485, respectively. CAM sub-array 423 performs a comparison operation with the third key of the second input data value $ID_2$. This comparison operation is performed in the manner described above for the third key of the first input data value $ID_1$.

Also during clock cycle T+3, the second, third and fourth keys of the third input data value $ID_3$ are stored in pipeline registers 481, 482 and 484, respectively. CAM sub-array 422 performs a comparison operation with the second key of the third input data value $ID_3$. This comparison operation is performed in the manner described above for the second key of the first input data value $ID_1$.

Also during clock cycle T+3, a fourth input data value $ID_4$[N-1:0] is clocked into input register 401 and divided into four keys by splitter logic 410, with the first key being provided to CAM sub-array 421. CAM sub-array 421 performs a comparison operation with the first key of the fourth input data value $ID_4$. This comparison operation is performed in the manner described above for the first key of the first input data value $ID_1$.

At the next clock cycle T+4, the output of multiplexer 454 is loaded into match register 464 and provided to priority encoder 440 and ANY_HIT decoder 441. Priority encoder 440 determines which one of the asserted match control signals has priority and generates a $log_2M$-bit address M_ADDR representative of this match control signal. Address M_ADDR provides the location of the longest match for the first input data value $ID_1$[N-1:0]. In the event of multiple longest matches, priority encoder 440 provides an address M_ADDR identifying the lowest matching address (i.e., the matching address with the highest priority). If there was no match associated with the first input data value (i.e., the match signals provided by match register 464 all have logic false values), then ANY_HIT decoder 441 provides a logic false ANY_HIT signal during clock cycle T+4. The latency of CAM system 400 is therefore four clock cycles. That is, the first valid result is returned four clock cycles after the first input data value $ID_1$ is provided to CAM system 400. The latency of CAM system is equal to the total number of CAM sub-arrays.

Also during clock cycle T+4, the fourth key of the second input data value $ID_2$ is clocked into pipeline register 486. CAM sub-array 424 performs a comparison operation with the fourth key of the second input data value $ID_2$. This comparison operation is performed in the manner described above for the fourth key of the first input data value $ID_1$.

Also during clock cycle T+4, the third and fourth keys of the third input data value $ID_3$ are stored in pipeline registers 483 and 485, respectively. CAM sub-array 423 performs a comparison operation with the third key of the third input data value $ID_3$. This comparison operation is performed in the manner described above for the third key of the first input data value $ID_1$.

Also during clock cycle T+4, the second, third and fourth keys of the fourth input data value $ID_4$ are stored in pipeline registers 481, 482 and 484, respectively. CAM sub-array 422 performs a comparison operation with the second key of the fourth input data value $ID_4$. This comparison operation is performed in the manner described above for the second key of the first input data value $ID_1$.

Also during clock cycle T+4, a fifth input data value $ID_5[N-1:0]$ is clocked into input register 401 and divided into four keys by splitter logic 410, with the first key being provided to CAM sub-array 421. CAM sub-array 421 performs a comparison operation with the first key of the fifth input data value $ID_5$. This comparison operation is performed in the manner described above for the first key of the first input data value $ID_1$.

Processing continues in the above-described manner, such that after clock cycle T+4, one result is provided by CAM system 400 during each clock cycle. Table 1 below summarizes processing of input data values $ID_1$–$ID_{10}$ during the first ten clock cycles T to T+9.

TABLE 1

| Clock Cycle | CAM 421 Processes The First Key of: | CAM 422 Processes The Second Key of: | CAM 423 Processes The Third Key of: | CAM 424 Processes The Fourth Key of: | Priority Encoder 440 Completes Process for: |
|---|---|---|---|---|---|
| T     | $ID_1$    | —      | —      | —      | —      |
| T + 1 | $ID_2$    | $ID_1$ | —      | —      | —      |
| T + 2 | $ID_3$    | $ID_2$ | $ID_1$ | —      | —      |
| T + 3 | $ID_4$    | $ID_3$ | $ID_2$ | $ID_1$ | —      |
| T + 4 | $ID_5$    | $ID_4$ | $ID_3$ | $ID_2$ | $ID_1$ |
| T + 5 | $ID_6$    | $ID_5$ | $ID_4$ | $ID_3$ | $ID_2$ |
| T + 6 | $ID_7$    | $ID_6$ | $ID_5$ | $ID_4$ | $ID_3$ |
| T + 7 | $ID_8$    | $ID_7$ | $ID_6$ | $ID_5$ | $ID_4$ |
| T + 8 | $ID_9$    | $ID_8$ | $ID_7$ | $ID_6$ | $ID_5$ |
| T + 9 | $ID_{10}$ | $ID_9$ | $ID_8$ | $ID_7$ | $ID_6$ |

Figure 5:
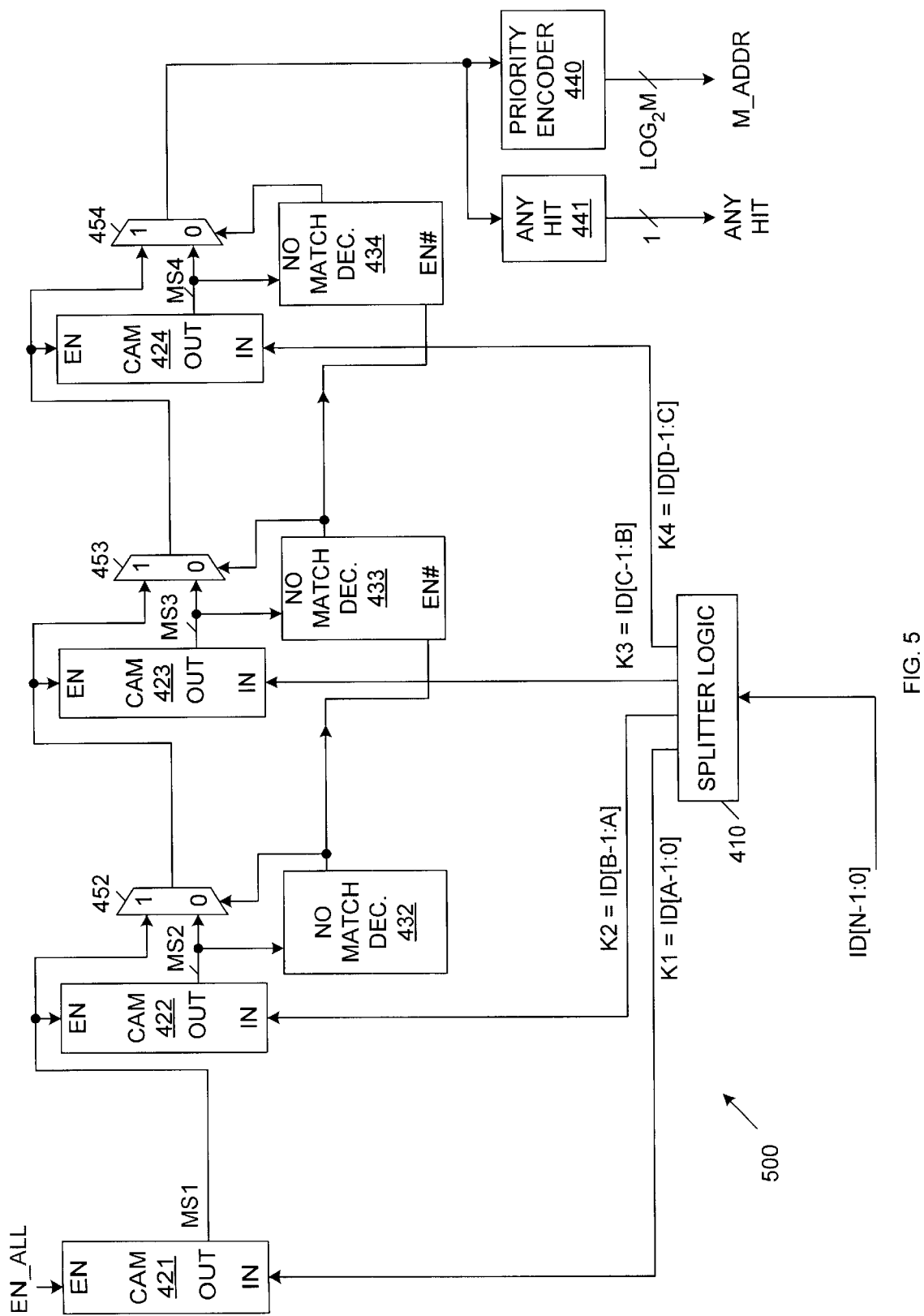
FIG. 5 is a block diagram of a CAM system having a combinatorial longest match capability in accordance with another embodiment of the present invention.

FIG. 5 is a block diagram of a CAM system 500 including longest match capability in accordance with another embodiment of the present invention. Because CAM system 500 is similar to CAM system 400 (FIG. 4), similar elements in FIGS. 4 and 5 are labeled with similar reference numbers. Thus, CAM system 500 includes CAM sub-arrays 421–424, splitter logic 410, no-match decoders 432–434, priority encoder 440, ANY_HIT decoder 441, and multiplexers 452–454. In general, CAM system 500 removes the sequential logic elements (i.e., registers) from CAM system 400, such that CAM system 500 includes only combinatorial logic.

CAM system 500 operates as follows. An input data value ID[N-1:0] is applied to splitter logic 410. As described above, splitter logic 410 divides input data value ID[N-1:0] into four key values K1–K4. These key values K1–K4 are simultaneously provided to CAM sub-arrays 421–424, respectively. In response to key value K1 and the EN_ALL signal, CAM sub-array 421 generates match signal MS1[M-1:0] in the manner described above. Match signal MS1[M-1:0] ripples through to CAM sub-array 422 and multiplexer 452.

In response to key value K2 and match signal MS1[M-1:0], CAM sub-array 422 generates match signal MS2[M-1:0] in the manner described above in connection with FIG. 4. Match signal MS2[M-1:0] is provided to multiplexer 452 and to no-match decoder 432. No-match decoder 432 operates in the manner described above to generate a control signal that controls multiplexer 452 and enables/disables no-match decoder 433. If no-match decoder 432 does not detect a match, no-match decoder 432 provides a logic high signal that causes multiplexer 452 to route match signal MS1[M-1:0] to CAM sub-array 423 and multiplexer 453. This logic high signal also disables no-match decoder 433, which causes the output of no-match decoder 433 to go to a logic high state. Conversely, if no-match decoder 432 detects a match, no-match decoder 432 provides a logic low signal that causes multiplexer 452 to route match signal MS2[M-1:0] to CAM sub-array 423 and multiplexer 453. This logic low signal also enables no-match decoder 433. In this manner, the results from CAM sub-arrays 421–422 ripple through to CAM sub-array 423, multiplexer 453 and no-match decoder 433.

CAM sub-array 423 processes key value K3 and the match signal passed by multiplexer 452 in the manner described above to generate match signal MS3[M-1:0]. No-match decoder 433 decodes match signal MS3[M-1:0], and in response, generates a signal that controls multiplexer 453 and enables/disables no-match decoder 434. If no-match decoder 433 does not detect a match, no match decoder 433 provides a logic high signal that causes multiplexer 453 to route the match signal received from multiplexer 452. This logic high signal also disables no-match decoder 434, which causes the output of no-match decoder 434 to go to a logic high state. Conversely, if no-match decoder 433 detects a match, no-match decoder 433 provides a logic low signal that causes multiplexer 453 to route match signal MS3[M-1:0]. This logic low signal also enables no-match decoder 434. In this manner, the results from CAM sub-arrays 421–423 ripple through to CAM sub-array 424, multiplexer 454 and no-match decoder 434.

CAM sub-array 424 processes key value K4 and the match signal routed by multiplexer 453 to generate match signal MS4[M-1:0]. No-match decoder 434 decodes match signal MS4[M-1:0], and in response, generates a signal that controls multiplexer 454. If no-match decoder 433 does not detect a match, no-match decoder 434 provides a logic high signal that causes multiplexer 454 to route the match signal received from multiplexer 453 to priority encoder 440 and ANY_HIT decoder 441. Conversely, if no-match decoder 434 detects a match, no-match decoder 434 provides a logic low signal that causes multiplexer 454 to route match signal MS4[M-1:0] to priority encoder 440 and ANY_HIT decoder 441. In response, priority encoder 440 and ANY_HIT decoder 441 generate the M_ADDR and ANY_HIT signals in the manner described above.

Because CAM system 500 uses only combinatorial logic, the results ripple through the CAM system independent of a clock signal. In general, the latency of CAM system 500 is typically lower than the latency of CAM system 400 (FIG. 4). After priority encoder 440 and ANY_HIT decoder 441 have provided one result, another input data value can be applied to splitter logic 410 to initiate another longest match comparison.

Figure 6:
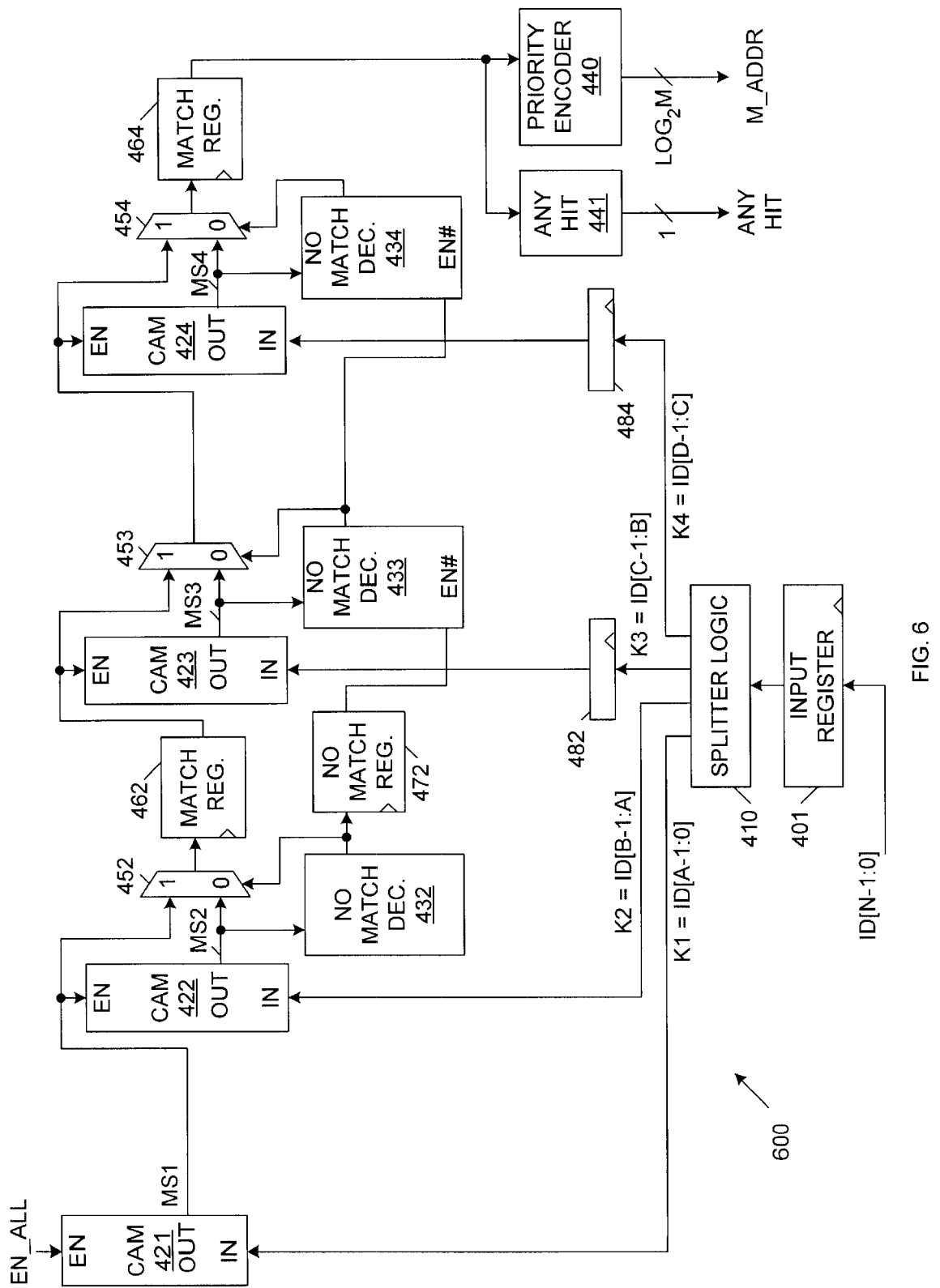
FIG. 6 is a block diagram of a CAM system having a pipelined/combinatorial longest match capability in accordance with another embodiment of the present invention.

FIG. 6 is a block diagram of a CAM system 600 including longest match capability in accordance with another embodiment of the present invention. Because CAM system 600 is similar to CAM system 400 (FIG. 4), similar elements in FIGS. 4 and 6 are labeled with similar reference numbers. Thus, CAM system 600 includes CAM sub-arrays 421–424, input register 401, splitter logic 410, no-match decoders 432–434, priority encoder 440, ANY_HIT decoder 441, multiplexers 452–454, match registers 462 and 464, no-match register 472, and pipeline latches 482 and 484. In general, CAM system 600 provides sequential logic elements after every N CAM sub-arrays. In the described embodiment, N is equal to two, such that sequential logic elements are provided after every other CAM sub-array. In other embodiments, N can be other integers. In yet other embodiments, sequential logic elements can be provided at irregular intervals.

CAM system 600 operates as follows. During a first clock cycle T, a first input data value $ID_1[N-1:0]$ is latched into input register 401 and provided to splitter logic 410. Splitter logic 410 divides input data value $ID_1[N-1:0]$ into four key values K1–K4. Key values K1 and K2 are simultaneously provided to CAM sub-arrays 421 and 422, respectively. CAM sub-arrays 421 and 422, no-match decoder 432 and multiplexer 452 operate in the same manner described above for CAM system 500 (FIG. 5), with the result from CAM sub-array 421 rippling to CAM sub-array 422 and multiplexer 452, no-match decoder 432 providing a control signal, and multiplexer 452 passing one of the match signals MS1 or MS2.

At the next clock cycle T+1, the match signal routed by multiplexer 452 is latched into match register 462, and the control signal generated by no-match decoder 432 is latched into no-match register 472. In addition, key values K3 and K4 of the first input data value $ID_1$ are latched into pipeline registers 482 and 484. At this time, CAM sub-array 423, multiplexer 453 and no-match decoder 433 operate in the manner described above for CAM system 500 (FIG. 5), with the result from multiplexer 453 rippling to CAM sub-array 424 and multiplexer 454, and the result from no-match decoder 433 being applied to enable/disable no-match decoder 434. CAM sub-array 424, multiplexer 454 and no-match decoder 434 then operate in the manner described above for CAM system 500 (FIG. 5), with the match signal routed by multiplexer 454 being provided to match register 464.

Also during clock cycle T+1, a second input data value $ID_2[N-1:0]$ is latched into input register 401 and provided to splitter logic 410. Splitter logic 410 divides the second input data value $ID_2[N-1:0]$ into four key values K1–K4. Key values K1 and K2 of the second input data value $ID_2$ are provided to CAM sub-array 421 and CAM sub-array 422, respectively, during clock cycle T+1. In response, CAM sub-arrays 421 and 422, no-match decoder 432 and multiplexer 452 operate in the same manner described above for CAM system 500 (FIG. 5).

At the next clock cycle T+2, the match signals routed by multiplexer 454 are latched into match register 464 and provided to priority encoder 440 and ANY_HIT register 441.

Also during clock cycle T+2, the match signal routed by multiplexer 452 and the signal provided by no-match decoder 432 (which are produced in response to key values K1 and K2 of the second data value $ID_2$) are latched into match register 462 and no-match register 472, respectively. Key values K3 and K4 of the second data value $ID_2$ are also latched into pipeline registers 482 and 484 at this time. CAM sub-arrays 423–424, multiplexers 453–454 and no-match decoders 433–434 then process the contents of match register 462, no-match register 472 and pipeline registers 482 and 484 in the manner described above, thereby providing a match signal at the output terminal of multiplexer 454.

Also during clock cycle T+2, a third input data value $ID_3[N-1:0]$ is loaded into input register 401 and provided to splitter logic 410. Key values K1 and K2 associated with the third input data value $ID_3$ are provided to CAM sub-arrays 421 and 422, respectively. CAM sub-arrays 421–422, multiplexer 452 and no-match decoder 432 process key values K1 and K2 in the manner described above.

Processing continues in the above-described manner, such that beginning with clock cycle T+2, one result is provided by CAM system 600 during each clock cycle. Table 2 below summarizes processing of input data values $ID_1$–$ID_{10}$ during the first ten clock cycles T to T+9.

TABLE 2

| Clock Cycle | CAM 421 Processes The First Key of: | CAM 422 Processes The Second Key of: | CAM 423 Processes The Third Key of: | CAM 424 Processes The Fourth Key of: | Priority Encoder 440 Completes Process for: |
|---|---|---|---|---|---|
| T | $ID_1$ | $ID_1$ | — | — | — |
| T + 1 | $ID_2$ | $ID_2$ | $ID_1$ | $ID_1$ | — |
| T + 2 | $ID_3$ | $ID_3$ | $ID_2$ | $ID_2$ | $ID_1$ |
| T + 3 | $ID_4$ | $ID_4$ | $ID_3$ | $ID_3$ | $ID_2$ |
| T + 4 | $ID_5$ | $ID_5$ | $ID_4$ | $ID_4$ | $ID_2$ |
| T + 5 | $ID_6$ | $ID_6$ | $ID_5$ | $ID_5$ | $ID_4$ |
| T + 6 | $ID_7$ | $ID_7$ | $ID_6$ | $ID_6$ | $ID_5$ |
| T + 7 | $ID_8$ | $ID_8$ | $ID_7$ | $ID_7$ | $ID_6$ |
| T + 8 | $ID_9$ | $ID_9$ | $ID_8$ | $ID_8$ | $ID_7$ |
| T + 9 | $ID_{10}$ | $ID_{10}$ | $ID_9$ | $ID_9$ | $ID_8$ |

The latency of CAM system 600 is therefore two clock cycles, which is less than the latency of CAM system 400 (FIG. 4), but greater than the latency of CAM system 500 (FIG. 5).

Figure 7:
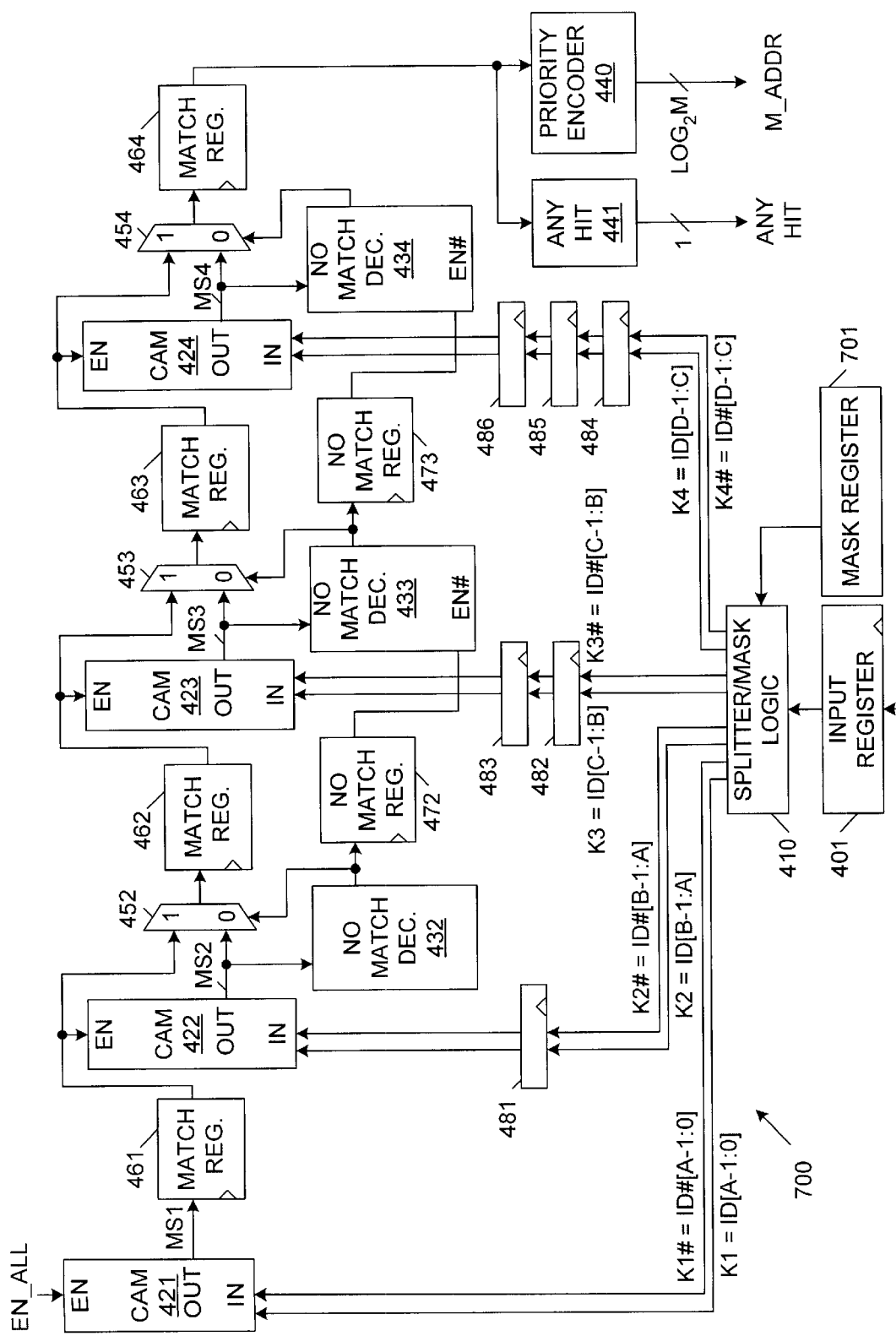
FIG. 7 is a block diagram of a CAM system, similar to the CAM system of FIG. 4, which has a key value masking capability.

FIG. 7 is a block diagram of a CAM system 700 that performs a longest match operation in accordance with another embodiment of the present invention. CAM system 700 is similar to CAM system 400 (FIG. 4). Consequently, similar elements in FIGS. 7 and 4 are labeled with similar reference numbers. In addition to the above-described elements of CAM system 400, CAM system 700 also includes mask register 701, which enables any bit or bits of the input data value ID[N-1:0] to be masked during the longest match operation. In this embodiment, each bit of key values K1–K4 is transmitted as a pair of signals. For example, each bit of key value K1 is transmitted as signal pair K1[x] and K1#[x], where x is an integer between (A-1) and 0 inclusive. A logic high bit of key value K1 is identified by a logic high signal K1[x] and a logic low signal K1#[x]. A logic low bit of key value K1 is identified by a logic low signal K1[x] and a logic high signal K1#[x]. A masked bit of key value K1 is identified by a logic low signal K1[x] and a logic low signal K1#[x]. In another embodiment, a masked bit of key value K1 can be identified by a logic high signal K1[x] and a logic high signal K1#[x].

The CAM cells in CAM sub-arrays 421–424 are configured to respond to the key values as follows. Prior to a comparison operation, the match line associated with each row of CAM cells is held at a predetermined logic state. Any CAM cell storing a value that does not match an applied comparison value will change the logic state of the match line, thereby indicating a no match condition. If each of the CAM cells in a row match the corresponding applied comparison values, the logic state of the match line will remain unchanged, thereby indicating a match condition. Any CAM cell receiving a masked bit of a key value will not cause the logic state of the corresponding match line to change logic state, regardless of the value stored by the CAM cell. As a result, the masked bit of a key value is effectively ignored during a longest match comparison. Commonly owned, co-pending U.S. patent application Serial No. 09/185,057, which is hereby incorporated by reference, describes CAM cells that are capable of operating in the manner described above. Other than the above-described key value masking capability, CAM system 700 operates in the same manner as CAM system 400 (FIG. 4).

The key value masking capability described above in connection with CAM system 700 (FIG. 7) can also be applied to CAM system 500 (FIG. 5) and CAM system 600 (FIG. 6) in the manner described below.

Figure 8:
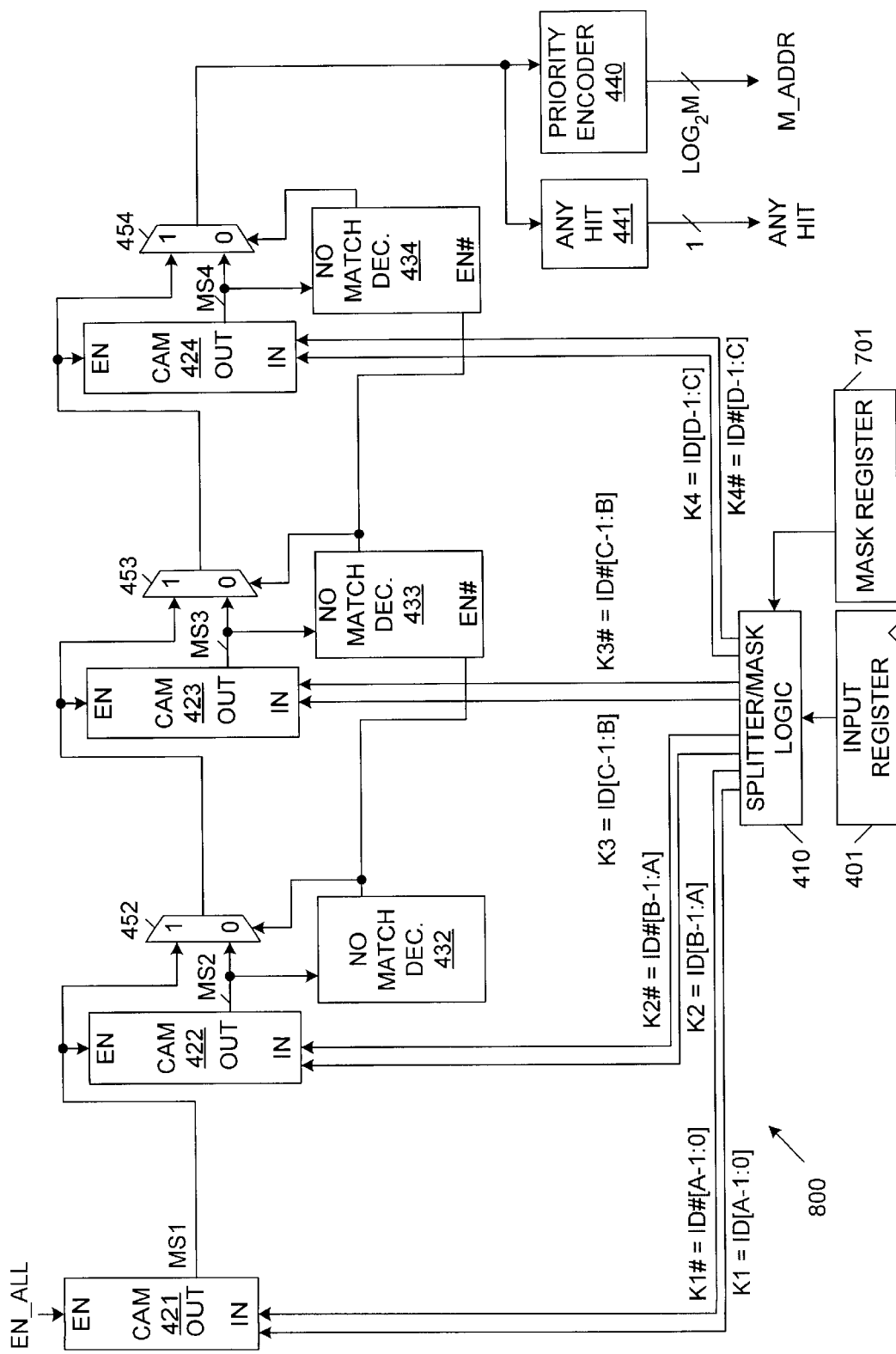
FIG. 8 is a block diagram of a CAM system, similar to the CAM system of FIG. 5, which has a key value masking capability.

FIG. 8 illustrates a CAM system 800 that applies the key value masking capability to CAM system 500 (FIG. 5). Similar elements in FIGS. 8 and 5 are labeled with similar reference numbers. In addition to the above-described elements of CAM system 500, CAM system 800 also includes mask register 701 and represents each bit of the key values as a pair of signals in the manner described above. These elements provide CAM system 800 with a key value masking capability in the manner described above in connection with CAM system 700. Other than the key value masking capability, CAM system 800 operates in the same manner as CAM system 500 (FIG. 5).

Figure 9:
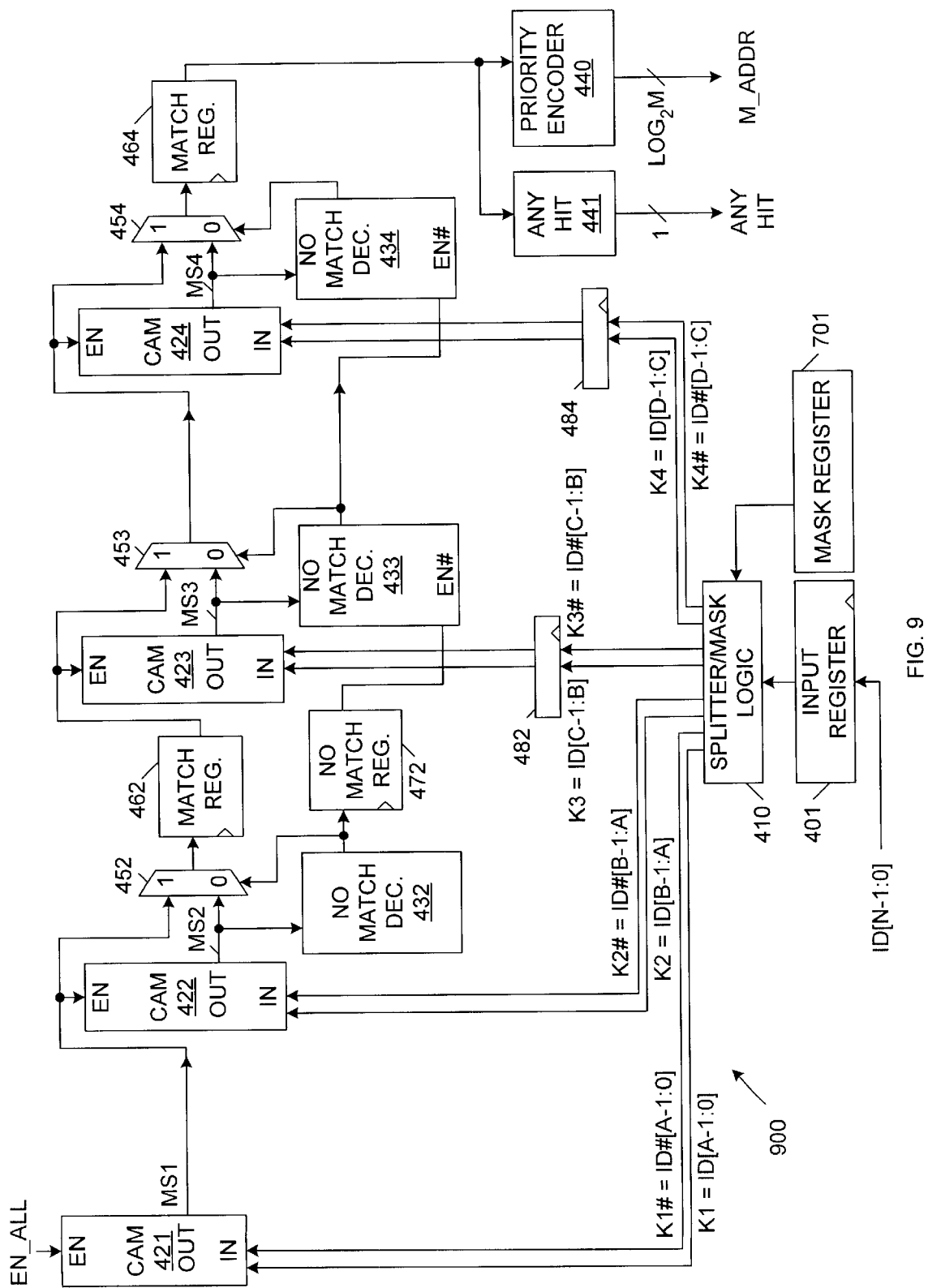
FIG. 9 is a block diagram of a CAM system, similar to the CAM system of FIG. 6, which has a key value masking capability.

FIG. 9 illustrates a CAM system 900 that applies the key value masking capability to CAM system 600 (FIG. 6). Similar elements in FIGS. 9 and 6 are labeled with similar reference numbers. In addition to the above-described elements of CAM system 600, CAM system 900 also includes mask register 701 and represents each bit of the key values as a pair of signals in the manner described above. These elements provide CAM system 900 with a key value masking capability in the manner described above in connection with CAM system 700. Other than the key value masking capability, CAM system 900 operates in the same manner as CAM system 600 (FIG. 6).

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A content addressable memory (CAM) system providing longest match capability, the CAM system comprising:

an input circuit coupled to receive an input data value and divide the input data value into a series of keys, the series of keys including a first key and a second key, the first key comprising one or more consecutive bits of the input data value, and a second key comprising one or more bits of the input data value consecutively following the first key; and a CAM array in a row-column arrangement, the CAM array including a first CAM sub-array and a second CAM sub-array, wherein:

the first CAM sub-array comprises the columns of the CAM array corresponding to the bits of the input data value included in the first key, the first CAM sub-array being coupled to receive the first key and generate a first match signal; and the second CAM sub-array comprises the columns of the CAM array corresponding to the bits of the input data value included in the second key, the second CAM sub-array being coupled to receive the second key and generate a second match signal.

2. The CAM system of claim 1, wherein each row of the second CAM sub-array includes a match logic circuit that is enabled or disabled by the first match signal.

3. The CAM system of claim 1, further comprising a first no-match decoder coupled to receive the second match signal, wherein the first no-match decoder determines whether no match exists for the first and second keys in the first and second CAM sub-arrays.

4. The CAM system of claim 3, further comprising a multiplexer having input terminals coupled to receive the first match signal and the second match signal, and a control terminal coupled to receive a control signal from the first no-match decoder.

5. The CAM system of claim 4, further comprising:

a first pipeline register coupled between the input circuit and the second CAM sub-array; and a match register coupled to an output terminal of the multiplexer, the first pipeline register and the match register being clocked by a clock signal.

6. The CAM system of claim 5, further comprising a first no-match register coupled to an output terminal of the first no-match decoder, wherein the first no-match register is clocked by the clock signal.

7. The CAM system of claim 4, further comprising a priority encoder coupled to an output terminal of the multiplexer.

8. The CAM system of claim 4, further comprising a decoder coupled to an output terminal of the multiplexer, wherein the decoder determines whether any match exists for the first key in the first CAM sub-array.

9. The CAM system of claim 1, wherein the series of keys further includes a third key, the third key comprising one or more bits of the input data value consecutively following the one or more bits of the second key, and wherein the CAM array further comprises a third CAM sub-array, the third CAM sub-array comprising the columns of the CAM array corresponding to the bits of the input data value included in the third key, the third CAM sub-array being coupled to receive the third key and generate a third match signal.

10. The CAM system of claim 9, wherein each row of the second CAM sub-array includes a match logic circuit that is enabled or disabled by the first match signal, and wherein each row of the third CAM sub-array includes a match logic circuit that is enabled or disabled by the second match signal.

11. The CAM system of claim 9, further comprising:

a first decoder coupled to receive the second match signal, wherein the first decoder determines when no match exists in the second CAM sub-array; and a second decoder coupled to receive the third match signal, wherein the second decoder determines when no match exists in the third CAM sub-array.

12. The CAM system of claim 11, wherein the first decoder is coupled to the second decoder, the second decoder being enabled and disabled by a control signal provided by the first decoder.

13. The CAM system of claim 11, further comprising:

a first multiplexer having input terminals coupled to receive the first match signal and the second match signal, and a control terminal coupled to receive a first control signal from the first decoder; and a second multiplexer having input terminals coupled to receive an output signal from the first multiplexer and the third match signal, and a control terminal coupled to receive a second control signal from the second decoder.

14. The CAM system of claim 13, further comprising a priority encoder coupled to receive an output signal from the second multiplexer.

15. The CAM system of claim 13, further comprising:

a first pipeline register coupled between the input circuit and the second CAM sub-array;

a second pipeline register coupled to receive the third key from the input circuit; and a third pipeline register coupled between the second pipeline register and the third CAM sub-array, wherein the first, second and third pipeline registers are clocked by a clock signal.

16. The CAM system of claim 15, further comprising a first match register coupled between the first CAM sub-array and the second CAM sub-array; and a second match register coupled between the second CAM sub-array and the third CAM sub-array, wherein the first and second match registers are clocked by the clock signal.

17. The CAM system of claim 1, further comprising a mask logic circuit for masking bits in the first key and the second key.

18. A content addressable memory (CAM) system comprising:
an input circuit configured to provide a first key and a second key, wherein the first and second keys include sequential, non-overlapping sub-fields of an input data value;
a first CAM sub-array having a plurality of rows of CAM cells, the first CAM sub-array being coupled to receive the first key, and in response, generate a first match signal that identifies each of the rows in the first CAM sub-array that matches the first key; and
a second CAM sub-array having a plurality of rows of CAM cells, the second CAM sub-array being coupled to receive the second key, and in response, generate a second match signal that identifies each of the rows in the second CAM sub-array that matches the first key and the second key.

19. The CAM system of claim 18, further comprising a first decoder coupled to receive the second match signal from the second CAM sub-array, wherein the first decoder determines when none of the rows in the first and second second CAM sub-arrays matches the first key and the second key.

20. The CAM system of claim 19, further comprising a multiplexer having input terminals coupled to receive the first and second match signals, and a control terminal coupled to receive a control signal from the first decoder.

21. The CAM system of claim 20, further comprising a priority encoder coupled to receive the first or second match signal from the multiplexer.

22. The CAM system of claim 18, wherein the first key includes the least significant bit (LSB) of the input data value.

23. The CAM system of claim 18, wherein the first key includes the most significant bit (MSB) of the input data value.

24. The CAM system of claim 18, the second sub-array further comprising match logic for each row of CAM cells, the match logic for each row being individually enabled or disabled by the first match signal.

25. The CAM system of claim 18, further comprising:
a match register coupled to receive the first match signal; and
a pipeline register coupled to receive the second key, wherein the match register and the pipeline register are clocked by a common clock signal.

26. The CAM system of claim 18, further comprising a mask logic circuit for masking bits of the first and second keys.

27. A content addressable memory (CAM) system comprising:
a splitter circuit configured to divide an input data value into a plurality of non-overlapping key values;
a plurality of CAM sub-arrays arranged in a row-column configuration, each of the CAM sub-arrays being configured to receive a corresponding one of the key values, and in response, provide a match signal, wherein each of the CAM sub-arrays includes match logic for selectively enabling and disabling individual rows of the CAM sub-arrays, the match signal from each of the CAM sub-arrays being coupled to the match logic of a subsequent adjacent CAM sub-array;
a plurality of selectors wherein each selector is coupled to receive a match signal from a corresponding CAM sub-array and a match signal from a previous CAM sub-array; and
a plurality of decoders, each being coupled to receive a match signal from a corresponding CAM sub-array and provide a control signal to a corresponding selector, wherein each control signal indicates whether the corresponding match signal is representative of a no-match condition.

28. The CAM system of claim 27, further comprising a set of registers associated with each of the CAM sub-arrays, wherein the registers are clocked by the same clock signal.

29. The CAM system of claim 27, further comprising mask logic for masking bits of the key values.

30. The CAM system of claim 27, further comprising a set of registers associated only with selected CAM sub-arrays, wherein the registers are clocked by the same clock signal.

31. The CAM system of claim 30, wherein a set of registers is associated with every N CAM sub-arrays, where N is an integer.

32. A content addressable memory (CAM) system comprising:
a splitter circuit configured to divide an input data value into a plurality of non-overlapping key values;
a plurality of CAM sub-arrays arranged in a row-column configuration, each of the CAM sub-arrays being configured to receive a corresponding one of the key values, and in response, provide a match signal, wherein each of the CAM sub-arrays includes match logic for selectively enabling and disabling individual rows of the CAM sub-arrays, the match signal from each of the CAM sub-arrays being coupled to the match logic of a subsequent adjacent CAM sub-array;
means for routing a match signal representative of a longest match; and
a priority encoder coupled to receive the match signal representative of the longest match from the means for routing.

33. The CAM system of claim 32, further comprising a decoder coupled to receive the match signal representative of the longest match from the means for routing, wherein the decoder determines whether any match exists for the first key in the first CAM sub-array.

34. A method of operating a content addressable memory (CAM) system including a CAM array arranged in a row-column formation, the method comprising the steps of:
generating a first key and a second key from an input data value, the first key comprising one or more consecutive bits of the input data value, and the second key comprising one or more consecutive bits of the input data value that adjoin the bits of the first key;
comparing the first key with data stored in each row of a first CAM sub-array, the first CAM sub-array comprising columns of the CAM array corresponding to the bits of the first key;
generating a first match signal that identifies rows of the first CAM sub-array that match the first key;
comparing the second key with the data stored in rows of a second CAM sub-array, wherein rows in the second CAM sub-array are enabled and disabled in response to the first match signal, the second CAM sub-array comprising columns of the CAM array corresponding to the bits of the second key; and generating a second match signal that identifies rows of the second CAM sub-array that match the second key.

35. The method of claim 34, wherein the first key includes the least significant bit (LSB) of the input data value.

36. The method of claim 34, wherein the first key includes the most significant bit (MSB) of the input data value.

37. The method of claim 34, further comprising the step of disabling a row of the second CAM sub-array if a corresponding row of the first CAM sub-array did not match the first key.

38. The method of claim 34, further comprising the steps of:

forwarding the second match signal as a forwarded match signal if a row in the first CAM sub-array matches the first key, and a corresponding row in the second CAM sub-array matches the second key; and forwarding the first match signal as the forwarded match signal if a row in the first CAM sub-array matches the first key, but no row in the second CAM sub-array matches the second key.

39. The method of claim 38, further comprising the steps of:

generating a third key from the input data value, the third key comprising one or more consecutive bits of the input data value that adjoin the bits of the second key;

comparing the third key with the data stored in rows of a third CAM sub-array, wherein rows in the third CAM sub-array are enabled and disabled in response to the forwarded match signal, the third CAM sub-array comprising columns of the CAM array corresponding to the bits of the third key; and generating a third match signal that identifies rows of the third CAM sub-array that match the third key.

40. The method of claim 39 further comprising the steps of:

disabling a row of the second CAM sub-array if a corresponding row of the first CAM sub-array did not match the first key; and disabling a row of the third CAM sub-array if a corresponding row of the second CAM sub-array did not match the second key.

41. The method of claim 39, further comprising the steps of:

forwarding the third match signal if a row in the first CAM sub-array matches the first key, a corresponding row in the second CAM sub-array matches the second key, and a corresponding row in the third CAM sub-array matches the third key;

forwarding the second match signal if a row in the first CAM sub-array matches the first key, a corresponding row in the second CAM sub-array matches the second key, but no row in the third CAM sub-array matches the third key; and forwarding the first match signal if a row in the first CAM sub-array matches the first key, but no row in the second CAM sub-array matches the second key.

42. The method of claim 34, further comprising the step of pipelining the operation of the first CAM sub-array and the second CAM sub-array.

43. The method of claim 34, further comprising the step of pipelining the operation of only one of the first CAM sub-array and the second CAM sub-array.

44. The method of claim 34, further comprising the step of masking bits of the key values.

* * * * *